United States Patent
Tsumura

[19]

[11] Patent Number: 6,075,978
[45] Date of Patent: *Jun. 13, 2000

[54] AUTOMATIC GAIN CONTROL SYSTEM AND METHOD OF AUTOMATIC GAIN CONTROL

[75] Inventor: Soichi Tsumura, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/821,470

[22] Filed: Mar. 21, 1997

[30] Foreign Application Priority Data

Mar. 21, 1996 [JP] Japan ..................................... 8-064193

[51] Int. Cl.[7] ....................................................... H04B 1/06
[52] U.S. Cl. .................................... 455/234.1; 455/241.2; 455/245.2
[58] Field of Search ............................ 455/234.1, 241.2, 455/245.1, 250.1, 251.1, 245.2, 253.2, 116, 126–127, 232.1, 234.2

[56] References Cited

U.S. PATENT DOCUMENTS

| | | |
|---|---|---|
| 4,403,346 | 9/1983 | Ogawa ............................. 455/241.1 X |
| 4,456,889 | 6/1984 | Kumar . |
| 4,827,511 | 5/1989 | Masuko ..................................... 380/15 |
| 4,955,077 | 9/1990 | Sugayama ............................ 455/197.1 |
| 5,001,776 | 3/1991 | Clark ................................. 455/234.1 X |
| 5,307,512 | 4/1994 | Mitzlaff . |
| 5,513,387 | 4/1996 | Saito et al. . |
| 5,590,418 | 12/1996 | Holoubek et al. ....................... 455/126 |

FOREIGN PATENT DOCUMENTS

| | | |
|---|---|---|
| 52-38823 | 3/1977 | Japan . |
| 52-42322 | 4/1977 | Japan . |
| 52-70733 | 6/1977 | Japan . |
| 53-115116 | 10/1978 | Japan . |
| 59-22415 | 2/1984 | Japan . |
| 61-133713 | 6/1986 | Japan . |
| 64-86702 | 3/1989 | Japan . |
| 3-24813 | 4/1991 | Japan . |
| 9634452 | 10/1996 | WIPO . |

OTHER PUBLICATIONS

Patent Abstracts of Japan vol. 008, No. 107 (E–245), May 19, 1984 & JP 59 022415 A (Fujitsu Ten KK), Feb. 4, 1984 Abstract.

Patent Abstracts of Japan vol. 017, No. 283 (E–1373), May 31, 1993 & JP 05 014088 A (Sanyo Electric Co. Ltd), Jan. 22, 1993 Abstract.

*Primary Examiner*—William G. Trost
*Attorney, Agent, or Firm*—Ostrolenk, Faber, Gerb & Soffen, LLP

[57] ABSTRACT

In a radio apparatus including a plurality of variable-gain amplifiers and at least one frequency converter which are connected in series, a gain controller includes a plurality of gain control lines and a gain control signal generator. The gain control lines are connected to the variable-gain amplifiers, respectively. The gain control signal generator individually generates a plurality of gain control signals which are supplied to the variable-gain amplifiers through the gain control lines, respectively.

4 Claims, 10 Drawing Sheets

AUTOMATIC GAIN CONTROL SYSTEM AND METHOD OF AUTOMATIC GAIN CONTROL

BACKGROUND OF THE INVENTION

1. Field of the invention

The present invention generally relates to automatic gain control (AGC) and, in particular, to a gain controller and method for a plurality of variable-gain amplifiers which are used in a radio apparatus such as a radio receiver or a radio transmitter.

2. Description of the Related Art

There has been disclosed a radio receiver including an AGC circuit which is designed to avoid distortion of an amplified signal and thereby improve a signal-to-noise ratio (S/N) in Japanese Patent examined Publication No. 3-24813. The radio receiver is provided with two radio-frequency (RF) variable gain amplifiers, a frequency converter, and an intermediate-frequency (IF) variable gain amplifier. The AGC circuit controls the respective gains of the RF amplifiers and the IF amplifier so as to keep the output signal level of the IF amplifier constant.

According to the conventional AGC circuit, the respective gains of the second RF amplifier and the IF amplifier are variable within different restricted gain ranges with respect to the output signal level of the IF amplifier. Referring to FIG. 4 of the above publication No. 3-24813, as the gain control signal Vc increases, the gains of the three amplifiers are sequentially reduced. More specifically, the gain of the IF amplifier is first reduced and then kept at a first reduced gain level. Since the gain of the IF amplifier is not reduced to below the first reduced gain level, in cases where the gain control signal Vc becomes further larger, the gain of the second RF amplifier is reduced and then kept at a second reduced gain level which is lower than the first reduced gain level. When the variable gain control signal Vc becomes furthermore larger, the gain of the first RF amplifier is finally reduced.

SUMMARY OF THE INVENTION

According to the conventional AGC as described above, however, as the radio received signal increases in level, a higher level of distortion occurs in the latter stage, that is, the frequency converter and the IF amplifier. In other words, even when the gain of the IF amplifier falls to the first reduced gain level, in cases where the first and second RF amplifiers are set to the maximum gain, the frequency converter receives a high level of RF signal from the second RF amplifier. Therefore, the IF amplifier also receives a high level of IF signal. This results in increased levels of distortion in the frequency converter and the IF amplifier.

It is possible to reduce distortion even in the case of high input level by increasing the chip areas of active devices or flowing larger current through transistors of output stages. However, such a method results in increased chip size and cost. Especially, in the case of battery-powered radio apparatuses, the larger power consumption, the shorter the life time of a battery.

Further, the conventional AGC circuit as described above has difficulty in providing electrical isolation among the RF and IF amplifiers. The reason is that these variable-gain amplifiers are controlled by a single control signal generated by a gain control signal generator. Needless to say, the higher the frequency and the input level, the lower the degree of isolation. Therefore, it is more difficult to provide electrical isolation between the first and second RF amplifiers. In addition, the single control signal is supplied to the RF and IF amplifiers through a single control line. This provides less isolation between them and, at worst, may cause the amplifiers to oscillate.

An object of the present invention is to provide a gain controller and a gain control method which achieves the stable amplification in a radio apparatus.

Another object of the present invention is to provide a gain controller and a gain control method which can reduce distortion in a radio apparatus without increasing the size and power consumption.

Still another object of the present invention is to provide a radio receiver and a radio transmitter which can improve the ratio of signal to noise with simplified circuit configuration.

According to an aspect of the present invention, in a radio apparatus which includes a plurality of variable-gain amplifiers and at least one frequency converter which are connected in series, a gain controller is comprised of a plurality of gain control lines connected to the variable-gain amplifiers, respectively, and a gain control signal generator for individually generating a plurality of gain control signals which are supplied to the variable-gain amplifiers through the gain control lines, respectively.

Since the gain control signals are individually supplied to the variable-gain amplifiers through the gain control lines, respectively, it can provide improved isolation between the variable-gain amplifiers and the effective prevention of malfunction such as undesired oscillation.

A frequency converter may be connected to a first stage for a relatively high frequency at one end and connected to a second stage for a relatively low frequency at the other end, each stage including at least one variable-gain amplifier. In this arrangement, the variable-gain amplifiers can individually vary in gain depending on the gain control signals, respectively, such that a variable-gain amplifier of the first stage decreases in gain before a variable-gain amplifier of the second stage does when the output signal increases in level to more than a predetermined level, and a variable-gain amplifier of the second stage increases in gain before a variable-gain amplifier of the first stage does when the output signal decreases in level to less than the predetermined level. Further, the first stage includes a first number of variable-gain amplifiers and the second stage includes a second number of variable-gain amplifiers, the first number being smaller than the second number.

The variable-gain amplifiers may individually vary in gain depending on the gain control signals, respectively, such that a leading variable-gain amplifier of the second stage decreases in gain before a variable-gain amplifier of the first stage does when the output signal increases in level to more than a predetermined level, and a variable-gain amplifier of the first stage increases in gain before the leading variable-gain amplifier of the second stage when the output signal decreases in level to less than the predetermined level.

The variable-gain amplifiers may individually vary in gain depending on the gain control signals, respectively, such that the variable-gain amplifiers sequentially decrease in gain in order of a signal stream when the output signal increases in level to more than a predetermined level, and the variable-gain amplifiers sequentially increase in gain in the reverse order of the signal stream when the output signal increases in level to more than a predetermined level.

The variable-gain amplifiers may individually vary in gain depending on the gain control signals, respectively, such that the variable-gain amplifiers sequentially decrease in gain in the reverse order of a signal stream when the output signal increases in level to more than a predetermined level, and the variable-gain amplifiers sequentially increase in gain in the order of the signal stream when the output signal increases in level to more than a predetermined level.

The respective input levels of the variable-gain amplifiers provided downstream of the signal stream are prevented from becoming higher than is necessary. This results in effectively reduced distortion and power consumption and further simplified circuit configuration, which can achieve space and cost saving.

DETAILED DESCRIPTION OF THE PREFERRED EMBODIMENTS

Gain Control of Receiver

Figure 1:
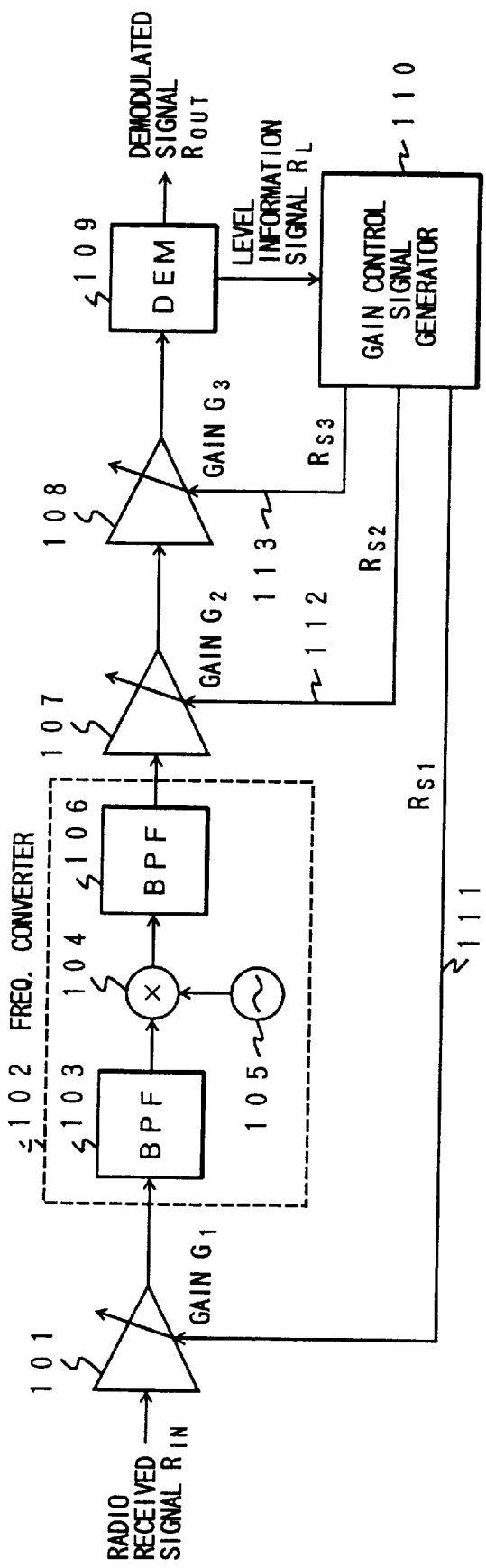
FIG. 1 is a block diagram showing a first embodiment of a gain control circuit applied to a radio receiver according to the present invention.

Referring to FIG. 1, a radio receiver is provided with a first variable-gain amplifier 101 which amplifies a radio-frequency (RF) received signal $R_{IN}$ by a controlled gain $G_1$. The output of the first variable-gain amplifier 101 is converted to an intermediate-frequency (IF) signal by a frequency converter 102. The frequency converter 102 is comprised of a first band-pass filter 103, a mixer 104, a local oscillator 105 and a second band-pass filter 106. The first band-pass filter 103 passes only signals of a predetermined RF band through. The mixer 104 mixes the RF signal with a local oscillation signal generated by the local oscillator 105 to produce the IF signal through the second band-pass filter 106. The IF signal is of an intermediate frequency corresponding to the frequency difference between the RF signal and the local oscillation signal. The second band-pass filter 106 removes components of undesired frequencies from the IF signal.

The IF signal is amplified by a second variable-gain amplifier 107 by a controlled gain $G_2$ and is further amplified by a third variable-gain amplifier 108 by a controlled gain $G_3$. After such an IF amplification, the IF signal is demodulated by a demodulator 109 into a demodulated signal $R_{OUT}$. The demodulator 109 includes a level information generator which generates level information of the IF signal using a predetermined threshold level $S_{TH}$ to produce a level information signal $R_L$ as will be described later. Based on the level information signal R received from the demodulator 109, a gain control signal generator 110 generates a plurality of gain control signals $R_{S1}$–$R_{S3}$ which are individually controllable. More specifically, the gain control signal generator 110 is provided with three control lines 111, 112 and 113 which are connected to the variable-gain amplifiers 101, 107 and 108 to control their gains $G_1$, $G_2$ and $G_3$, respectively. These gains $G_1$, $G_2$ and $G_3$ are controlled so that the input level of the demodulator 109 is kept constant.

It is here assumed that the respective gains $G_1$, $G_2$ and $G_3$ of the variable-gain amplifiers 101, 107 and 108 increase as the respective levels of gain control signals $R_{S1}$–$R_{S3}$ become higher and, contrarily, the respective gains $G_1$, $G_2$ and $G_3$ decrease as the respective levels of gain control signals $R_{S1}$–$R_{S3}$ become lower.

It is further assumed that the level information signal $R_L$ increases as the level of the IF signal falls to less than the threshold level $S_{TH}$ and, contrarily, the level information signal $R_L$ decreases as the level of the IF signal rises to more than the threshold level $S_{TH}$. In other words, the level information signal $R_L$ varies so that a variation of the level of the IF signal is canceled.

And, as the level information signal $R_L$ increases and decreases in level, the respective levels of gain control signals $R_{S1}$–$R_{S3}$ become higher or lower. Therefore, the gains $G_1$, $G_2$ and $G_3$ individually increase and decrease as the level information signal $R_L$ increases and decreases in level. Needless to say, the level information signal $R_L$ may decrease and increase as the level of the IF signal rises and falls with respect to the threshold level $S_{TH}$ and the gains $G_1$, $G_2$ and $G_3$ individually increase and decrease as the level information signal $R_L$ increases and decreases in level. The details will be described referring to FIG. 2 and FIG. 3.

First Embodiment of Gain Control

Figure 2:
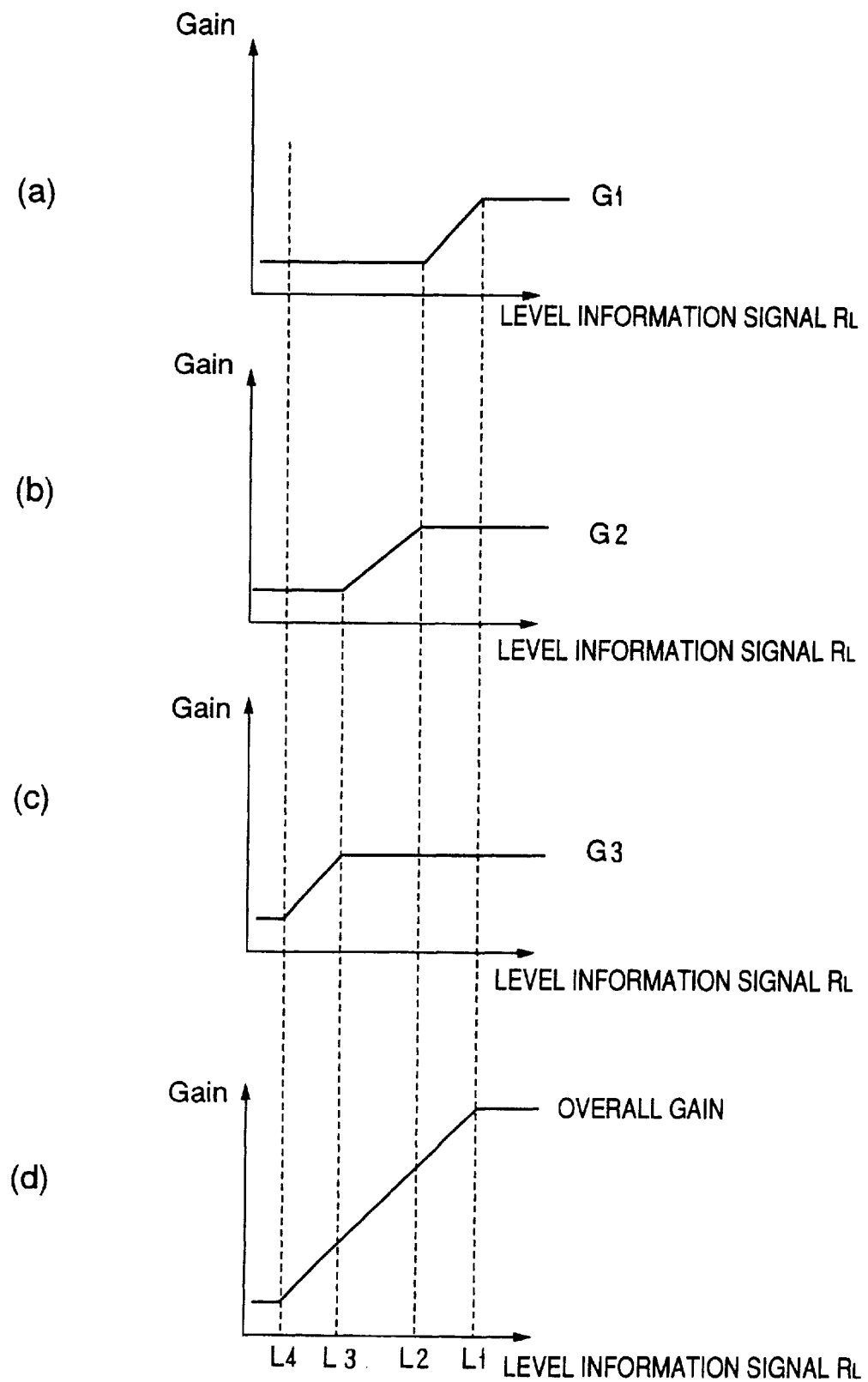
FIG. 2 is a graph showing a first embodiment of a gain control method applied to the radio receiver according to the present invention.

As shown in FIG. 2, the gains $G_1$, $G_2$ and $G_3$ vary with respect to the level information signal $R_L$ within predetermined gain ranges, respectively. More specifically, in cases where the level of the IF signal rises to more than the threshold level $S_{TH}$, the level information signal $R_L$ decreases as described above. While the level information signal $R_L$ drops from a high level $L_1$ to a low level $L_4$, the gains $G_1$, $G_2$ and $G_3$ sequentially drop in the order presented.

Firstly, the gain $G_1$ falls to a low level while the level information signal $R_L$ drops from the level $L_1$ to a lower level $L_2$ as shown in FIG. 2(a), secondly the gain $G_2$ falls to a low level while the level information signal $R_L$ drops from the level $L_2$ to a lower level $L_3$ as shown in FIG. 2(b), and finally the gain $G_3$ falls to a low level while the level information signal $R_L$ drops from the level $L_3$ to a lower level $L_4$ as shown in FIG. 2(c). In other words, referring to FIG. 1, the variable-gain amplifiers 101, 107 and 108 decrease in gain in decreasing order of frequency.

Contrarily, referring to FIG. 2, while the level information signal $R_L$ rises from the low level $L_4$ to the high level $L_1$, the gains $G_1$, $G_2$ and $G_3$ sequentially rise in the reverse order presented.

Firstly, the gain $G_3$ rises to a high level while the level information signal $R_L$ rises from the level $L_4$ to the level $L_3$ as shown in FIG. 2(c), secondly the gain $G_2$ rises to a high level while the level information signal $R_L$ rises from the level $L_3$ to the level $L_2$ as shown in FIG. 2(b), and finally the gain $G_1$ rises to a high level while the level information signal $R_L$ rises from the level $L_2$ to the level $L_1$ as shown in FIG. 2(a). In other words, referring to FIG. 1, the variable-gain amplifiers 101, 107 and 108 increase in gain in ascending order of frequency.

In this manner, the overall gain of the variable-gain amplifiers 101, 107 and 108 is varied according to the level information signal $R_L$ as shown in FIG. 2(d) so that the input level of the demodulator 109 is kept constant.

As described above, when the received signal $R_{IN}$ increases in level to the extent of the signal-to-noise ratio (S/N) becoming insignificant, the gain control circuit of the radio receiver first lowers the gain $G_1$ of the first variable-gain amplifier 101. Therefore, the respective input levels of the frequency converter 102, the second variable-gain amplifier 107 and the third variable-gain amplifier 108 are prevented from becoming higher than is necessary. This results in effectively reduced distortion and power consumption and further simplified circuit configuration, which can achieve space and cost saving.

Further, according to the above embodiment, the gain control signals $R_{S1}$–$R_{S3}$ are individually supplied to the variable-gain amplifiers 101, 107 and 108 through the control lines 111, 112 and 113, respectively. Such a configuration provides improved isolation between the variable-gain amplifiers and the effective prevention of malfunction such as undesired oscillation.

Furthermore, according to the above embodiment, the variable range of gain for IF signals is wider than that for RF signals. More specifically, the total variable range (FIG. 2(b) and (c)) of gains of the IF amplifiers 107 and 108 is wider than the variable range (FIG. 2(a)) of gain of the RF amplifier 101. This easily provides further improved isolation between the variable-gain amplifiers because a lower frequency generally reduces electromagnetic coupling.

Second Embodiment of Gain Control

As described above, when the received signal $R_{IN}$ increases in level, the gain control circuit of the radio receiver first lowers the gain $G_1$ of the first variable-gain amplifier 101. This results in slightly degraded S/N at the input of the demodulator 109. Needless to say, when the received signal $R_{IN}$ increases in level to such an extent that the respective input levels of the following stages are sufficiently high, the S/N problem can be negligible.

The S/N problem, however, comes up when the received signal $R_{IN}$ reduces in level to such an extent that the S/N problem cannot be negligible and the input level of the following frequency converter 102 does not increase to the extent of distortion occurring. In this case, the following gain control method can improve the S/N and reduce the distortion.

Figure 3:
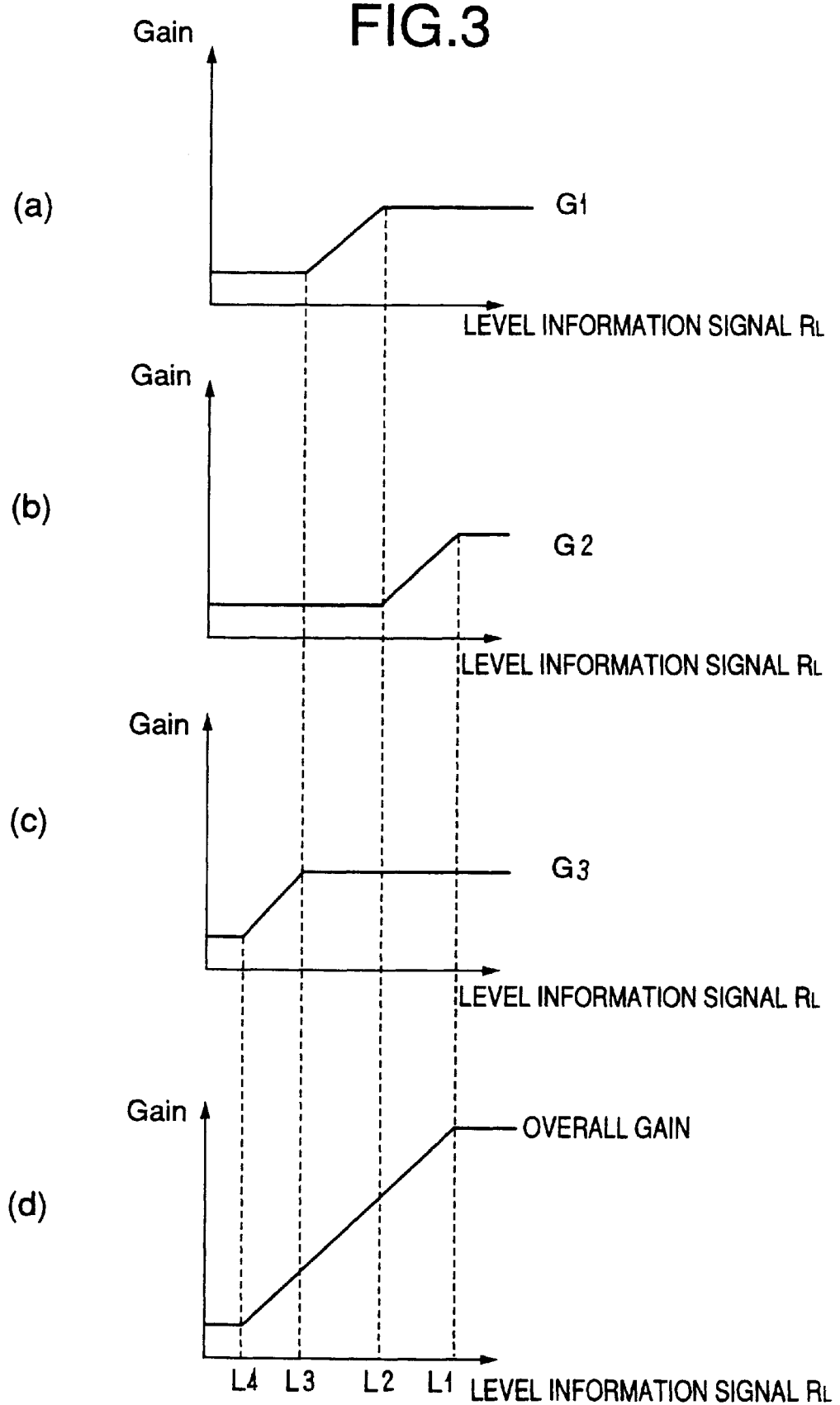
FIG. 3 is a graph showing a second embodiment of a gain control method applied to the radio receiver according to the present invention.

As shown in FIG. 3, the gains $G_1$, $G_2$ and $G_3$ vary with respect to the level information signal $R_L$ within predetermined gain ranges, respectively. While the level information signal $R_L$ drops from a high level $L_1$ to a level $L_4$, the gains $G_2$, $G_1$ and $G_3$ sequentially drop in the order presented. Firstly, the gain $G_2$ falls to a low level while the level information signal $R_L$ drops from the high level $L_1$ to a lower level $L_2$ as shown in FIG. 3(b), secondly the gain $G_1$ falls to a low level while the level information signal $R_L$ drops from the level $L_2$ to a lower level $L_3$ as shown in FIG. 3(a), and finally the gain $G_3$ falls to a low level while the level information signal $R_L$ drops from the level $L_3$ to a lower level $L_4$ as shown in FIG. 3(c). In other words, referring to FIG. 1, the IF variable-gain amplifier 107 first decreases in gain and then the IF variable-gain amplifier 108 decreases in gain. Finally, the RF variable-gain amplifier 101 decreases in gain.

Contrarily, referring to FIG. 3, while the level information signal $R_L$ rises from the low level $L_4$ to the high level $L_1$, the gains $G_2$, $G_1$ and $G_3$ sequentially rise in the reverse order presented. Firstly, the gain $G_3$ rises to a high level while the level information signal $R_L$ rises from the level $L_4$ to the level $L_3$ as shown in FIG. 3(c), secondly the gain $G_1$ rises to a high level while the level information signal $R_L$ rises from the level $L_3$ to the level $L_2$ as shown in FIG. 3(a), and finally the gain $G_2$ rises to a high level while the level information signal $R_L$ rises from the level $L_2$ to the level $L_1$ as shown in FIG. 3(b).

In this manner, the overall gain of the variable-gain amplifiers 101, 107 and 108 is varied according to the level information signal $R_L$ as shown in FIG. 2(d) so that the input level of the demodulator 109 is kept constant.

As described above, according to the second embodiment, the second IF variable-gain amplifier 107 first decreases in gain in cases where the received signal $R_{IN}$ reduces in level to such an extent that the S/N problem cannot be negligible and the input level of the frequency converter 102 does not increase to the extent of distortion occurring. Therefore, the S/N degradation and the signal distortion of the third variable-gain amplifier 108 are reduced. When the received signal $R_{IN}$ increases in level to the extent of the S/N problem becoming negligible, the first RF variable-gain amplifier 101 decreases in gain, which can achieves improved S/N and reduced distortion.

Gain Control of Transmitter

Figure 4:
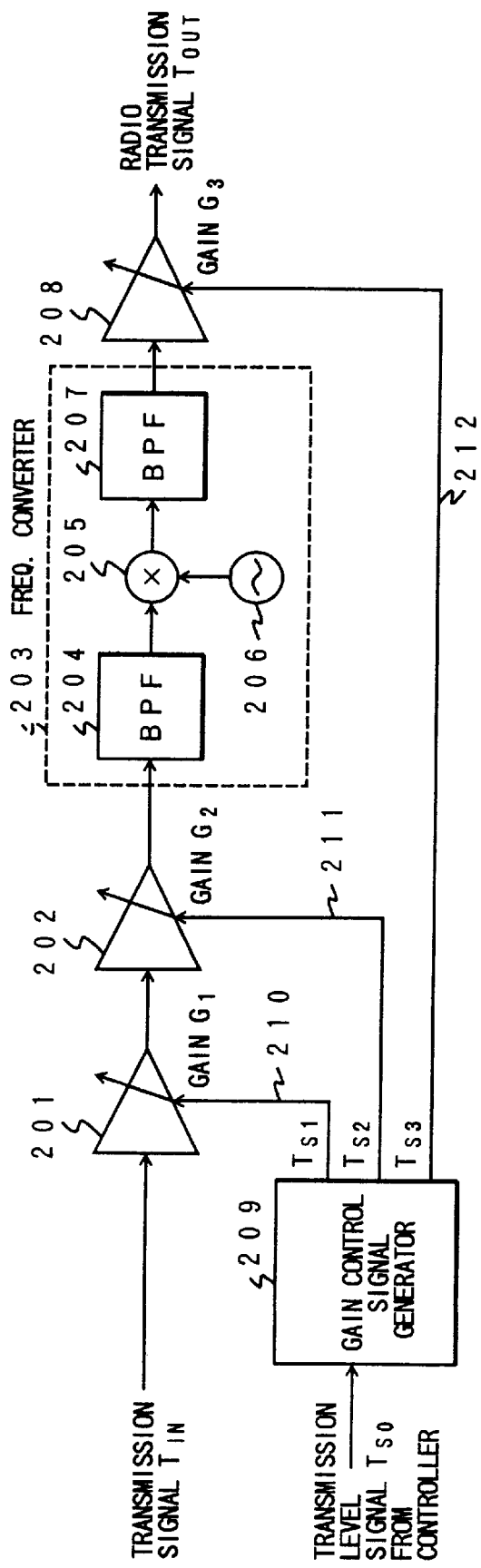
FIG. 4 is a block diagram showing a second embodiment of a gain control circuit applied to a radio transmitter according to the present invention.

Referring to FIG. 4, a radio transmitter is provided with a first and second variable-gain amplifiers 201 and 202 which are used to amplify IF signals. The first variable-gain amplifier 201 amplifies a transmission signal $T_{IN}$ by a controlled gains $G_1$ and the second variable-gain amplifier 202 further amplifies the output of the first variable-gain amplifier 201 by a controlled gain $G_2$. The output of the second variable-gain amplifier 202 is converted to an RF signal by a frequency converter 203. The frequency converter 203 is comprised of a first band-pass filter 204, a mixer 205, a local oscillator 206 and a second band-pass filter 207. The first band-pass filter 204 passes only signals of a predetermined IF band through. The mixer 205 mixes the IF signal with a local oscillation signal generated by the local oscillator 206 to produce the RF signal through the second band-pass filter 207. The RF signal is of a radio frequency corresponding to the frequency difference between the IF signal and the local oscillation signal. The second band-pass filter 207 removes components of undesired frequencies from the RF signal. A third variable-gain amplifier 208 amplifies the RF signal by a controlled gain $G_3$ to produce a radio transmission signal $T_{OUT}$.

A gain control signal generator 209 generates a plurality of gain control signals $T_{S1}$–$T_{S3}$ which are individually controllable based on a transmission level signal $T_{S0}$ which is received from a transmission controller (not shown). More specifically, the gain control signal generator 209 is provided with three control lines 210, 211 and 212 which are connected to the variable-gain amplifiers 201, 202 and 208 to control their gains $G_1$, $G_2$ and $G_3$, respectively.

It is here assumed that the respective gains $G_1$, $G_2$ and $G_3$ of the variable-gain amplifiers 201, 202 and 208 increase as the respective levels of gain control signals $T_{S1}$–$T_{S3}$ become higher and, contrarily, the respective gains $G_1$, $G_2$ and $G_3$ decrease as the respective levels of gain control signals $T_{S1}$–$T_{S3}$ become lower. It is further assumed that the level of the radio transmission signal $T_{OUT}$ increases as the transmission level signal $T_{S0}$ becomes larger. In other words, the transmission controller varies the transmission level signal $T_{S0}$ in level so that a variation of level of the RF transmission signal $T_{OUT}$ is canceled and the level of the RF transmission signal $T_{OUT}$ is kept constant because the transmission controller produces the transmission signal $T_{IN}$. The details will be described referring to FIG. 5.

Figure 5:
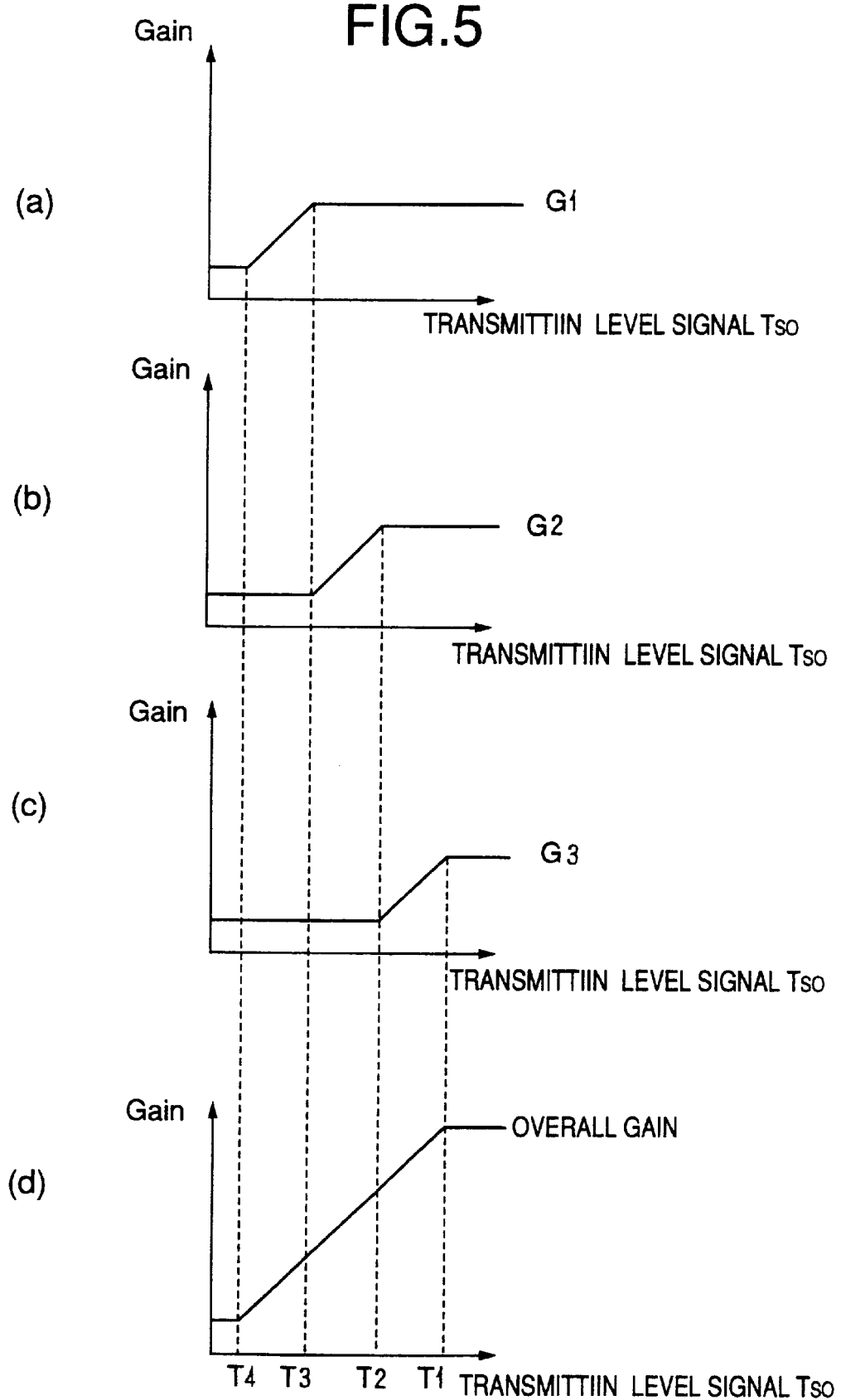
FIG. 5 is a graph showing a third embodiment of a gain control method applied to the radio transmitter according to the present invention.

As shown in FIG. 5, the gains $G_1$, $G_2$ and $G_3$ vary with respect to the transmission level signal $T_{S0}$ within predetermined gain ranges, respectively. More specifically, while the transmission level signal $T_{S0}$ rises from the low level $T_4$ to the high level $T_1$, the gains $G_1$, $G_2$ and $G_3$ sequentially rise in the order presented. Firstly, the gain $G_1$ rises to a high level while the transmission level signal $T_{S0}$ rises from the level $T_4$ to the level $T_3$ as shown in FIG. 5(a), secondly the gain $G_2$ rises to a high level while the transmission level signal $T_{S0}$ rises from the level $T_3$ to the level $T_2$ as shown in FIG. 5(b), and finally the gain $G_3$ rises to a high level while the transmission level signal $T_{S0}$ rises from the level $T_2$ to the level $T_1$ as shown in FIG. 5(c). In other words, referring to FIG. 4, the variable-gain amplifiers 201, 202 and 208 increase in gain in ascending order of frequency.

Contrarily, referring to FIG. 5, while the transmission level signal $T_{S0}$ falls from the high level $T_1$ to the low level $T_4$, the gains $G_1$, $G_2$ and $G_3$ sequentially drop in the reverse order presented. Firstly, the gain $G_3$ drops to a low level while the transmission level signal $T_{S0}$ lowers from the level $T_1$ to the level $T_2$ as shown in FIG. 5(c), secondly the gain $G_2$ drops to a low level while the transmission level signal $T_{S0}$ drops from the level $T_2$ to the level $T_3$ as shown in FIG. 5(b), and finally the gain $G_1$ drops to a low level while the transmission level signal $T_{S0}$ drops from the level $T_3$ to the level $T_4$ as shown in FIG. 5(a). In other words, referring to FIG. 4, the variable-gain amplifiers 201, 202 and 208 decrease in gain in descending order of frequency.

In this manner, the overall gain of the variable-gain amplifiers 201, 202 and 208 is varied according to the transmission level signal $T_{S0}$ as shown in FIG. 5(d) so that the level of the radio transmission signal $T_{OUT}$ is kept constant.

As described above, the gain control circuit of the radio transmitter first lowers and finally raise the gain $G_3$ of the third variable-gain amplifier 208 to lower and increase the level of the radio transmission signal $T_{OUT}$. Since a large part of power consumption is made by the third variable-gain amplifier 208, the gain control circuit remarkably reduces in power consumption.

In addition, since the gain control circuit first lowers the gain $G_3$ of the third variable-gain amplifier 208 to lower the level of the radio transmission signal $T_{OUT}$, the level control of the radio transmission signal $T_{OUT}$ is performed with minimizing the degradation of S/N. Such a gain control circuit provides advantages in communication systems with small transmission power, such as a CDMA (code division multiple access) system employing a direct sequence scheme.

Further, the gain control signals $T_{S1}$–$T_{S3}$ are individually supplied to the variable-gain amplifiers 201, 202 and 208 through the control lines 210, 211 and 212, respectively. Such a configuration provides improved isolation between the variable-gain amplifiers and the effective prevention of malfunction such as undesired oscillation.

Furthermore, the variable range of gain for IF signals is wider than that for RF signals. More specifically, the total variable range (FIG. 5(a) and (b)) of gains of the IF amplifiers 201 and 202 is wider than the variable range (FIG. 5(c)) of gain of the RF amplifier 208. This easily provides further improved isolation between the variable-gain amplifiers because a lower frequency generally reduces electromagnetic coupling.

It is possible to set the respective variable-gain amplifiers 201, 202 and 208 to a gain of 0 dB which means that they are each powered off. In the case where the respective variable-gain amplifiers 201, 202 and 208 can be powered off, the total power consumption of the transmitter is dramatically reduced by applying the control method as shown in FIG. 5.

Figure 6:
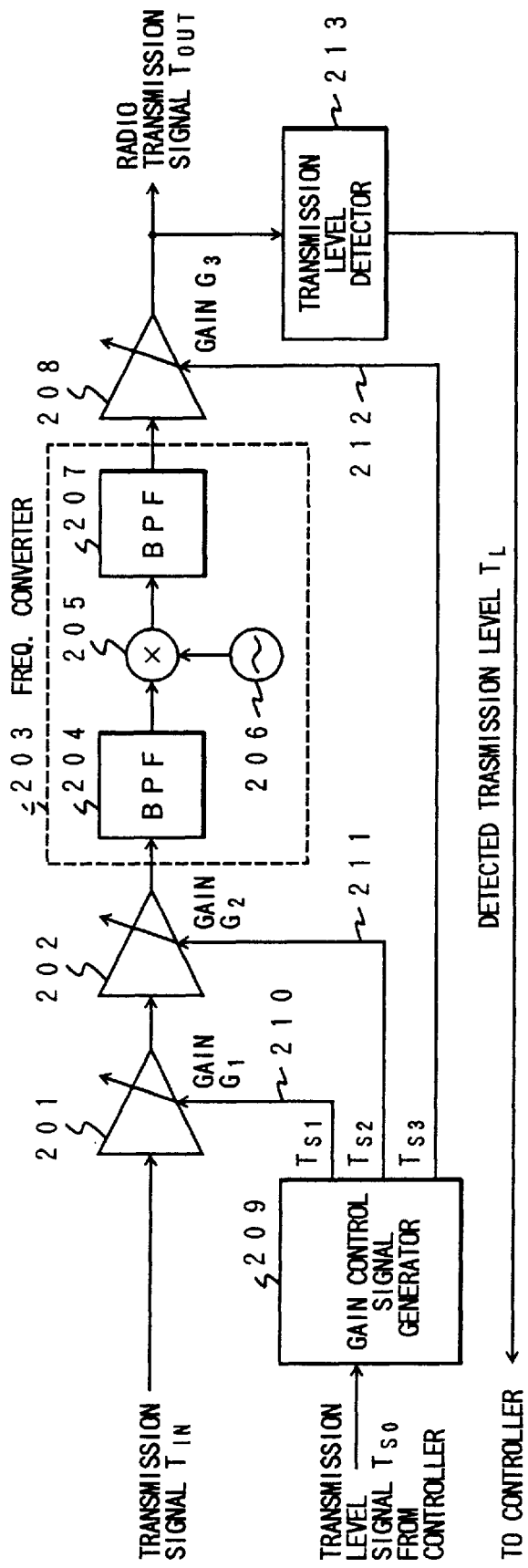
FIG. 6 is a block diagram showing a third embodiment of a gain control circuit applied to the radio transmitter according to the present invention.

Referring to FIG. 6, where circuit blocks similar to those previously described with reference to FIG. 4 are denoted by the same reference numerals, a radio transmitter is provided with a transmission level detector 213 which is connected to the output of the third variable-gain amplifier 208. The transmission level detector 213 produces a detected transmission level signal $T_L$ from the radio transmission signal $T_{OUT}$ and feeds it back to the transmission controller (not shown). The transmission controller receives the detected transmission level signal $T_L$ and makes a correction to the transmission level signal $T_{S0}$ using the detected transmission level signal $T_L$. The gain control signal generator 209, as described before, generates the gain control signals $T_{S1}$–$T_{S3}$ which are individually controllable based on the corrected transmission level signal $T_{S0}$ which is received from the transmission controller. The correction of the transmission level signal $T_{S0}$ is performed when the level of the radio transmission signal $T_{OUT}$ increases to such an extent that the transmission level signal $T_L$ can be accurately detected.

It is here assumed that the respective gains $G_1$, $G_2$ and $G_3$ of the variable-gain amplifiers 201, 202 and 208 increase as the respective levels of gain control signals $T_{S1}$–$T_{S3}$ become higher and, contrarily, the respective gains $G_1$, $G_2$ and $G_3$ decrease as the respective levels of gain control signals $T_{S1}$–$T_{S3}$ become lower. It is further assumed that the level of the radio transmission signal $T_{OUT}$ increases as the transmission level signal $T_{S0}$ becomes larger. In other words, the transmission controller varies the corrected transmission level signal $T_{S0}$ in level so that a variation of level of the RF transmission signal $T_{OUT}$ is canceled.

In this transmitter, the gain control as shown in FIG. 5 is also performed. The gains $G_1$, $G_2$ and $G_3$ vary with respect to the corrected transmission level signal $T_{S0}$ within predetermined gain ranges, respectively. More specifically, while the corrected transmission level signal $T_{SO}$ rises from the low level $T_4$ to the high level $T_1$, the gains $G_1$, $G_2$ and $G_3$ sequentially rise in the order presented. Firstly, the gain $G_1$ rises to a high level while the corrected transmission level signal $T_{SO}$ rises from the level $T_4$ to the level $T_3$ as shown in FIG. 5(a), secondly the gain $G_2$ rises to a high level while the corrected transmission level signal $T_{SO}$ rises from the level $T_3$ to the level $T_2$ as shown in FIG. 5(b), and finally the gain $G_3$ rises to a high level while the corrected transmission level signal $T_{SO}$ rises from the level $T_2$ to the level $T_1$ as shown in FIG. 5(c). In other words, referring to FIG. 6, the variable-gain amplifiers 201, 202 and 208 increase in gain in ascending order of frequency.

Contrarily, referring to FIG. 5, while the corrected transmission level signal $T_{SO}$ falls from the high level $T_1$ to the low level $T_4$, the gains $G_1$, $G_2$ and $G_3$ sequentially drop in the reverse order presented. Firstly, the gain $G_3$ drops to a low level while the corrected transmission level signal $T_{SO}$ lowers from the level $T_1$ to the level $T_2$ as shown in FIG. 5(c), secondly the gain $G_2$ drops to a low level while the corrected transmission level signal $T_{SO}$ drops from the level $T_2$ to the level $T_3$ as shown in FIG. 5(b), and finally the gain $G_1$ drops to a low level while the corrected transmission level signal $T_{SO}$ drops from the level $T_3$ to the level $T_4$ as shown in FIG. 5(a). In other words, referring to FIG. 6, the variable-gain amplifiers 201, 202 and 208 decrease in gain in descending order of frequency.

In this manner, the overall gain of the variable-gain amplifiers 201, 202 and 208 is varied according to the corrected transmission level signal $T_{SO}$ as shown in FIG. 5(d) so that the level of the radio transmission signal $T_{OUT}$ is kept constant. Since the transmission level signal $T_L$ is fed back to be used to correct the transmission level signal $T_{SO}$, a more accurate level control of the radio transmission signal $T_{OUT}$ can be achieved.

Further, the gain control circuit of the radio transmitter first lowers and finally raise the gain $G_3$ of the third variable-gain amplifier 208 to lower and increase the level of the radio transmission signal $T_{OUT}$. Since a large part of power consumption is made by the third variable-gain amplifier 208, the gain control circuit remarkably reduces in power consumption. In addition, since the gain control circuit first lowers the gain $G_3$ of the third variable-gain amplifier 208 to lower the level of the radio transmission signal $T_{OUT}$, the level control of the radio transmission signal $T_{OUT}$ is performed with minimizing the degradation of S/N. Such a gain control circuit provides advantages in communication systems with small transmission power as described before.

It should be noted that the correction of the transmission level signal $T_{SO}$ is not performed when the level of the radio transmission signal $T_{OUT}$ decreases to such an extent that the transmission level signal $T_L$ cannot be accurately detected. In such a case, the transmission controller supplies the transmission level signal $T_{SO}$ to the gain control signal generator 209 as in the case of FIG. 4.

Details of Circuits

Variable-Gain Amplifier

A variable-gain amplifier as shown in FIGS. 1, 4 and 6 may be comprised of a variable attenuator and a fixed-gain amplifier which are connected in series.

Figure 7A:
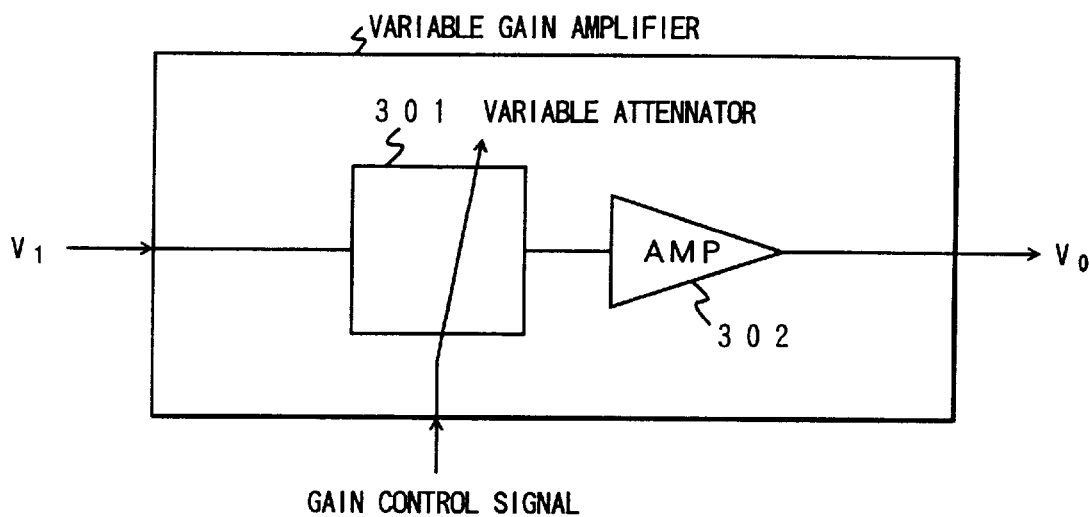
FIG. 7A is a diagram showing an example of a variable gain amplifier used in the first, second and third embodiments of the gain control circuit.

Referring to FIG. 7A, the variable attenuator 301 receives an input signal $V_I$ and attenuates it according to the gain control signal. The output of the variable attenuator 301 is then amplified by the fixed-gain amplifier 302. In this arrangement, the gain control is performed by the variable attenuator 301 before amplification. Therefore, even when the input signal $V_I$ becomes larger in level, the input level of the fixed-gain amplifier 302 is restricted, resulting in reduced distortion in the fixed-gain amplifier 302.

Figure 7B:
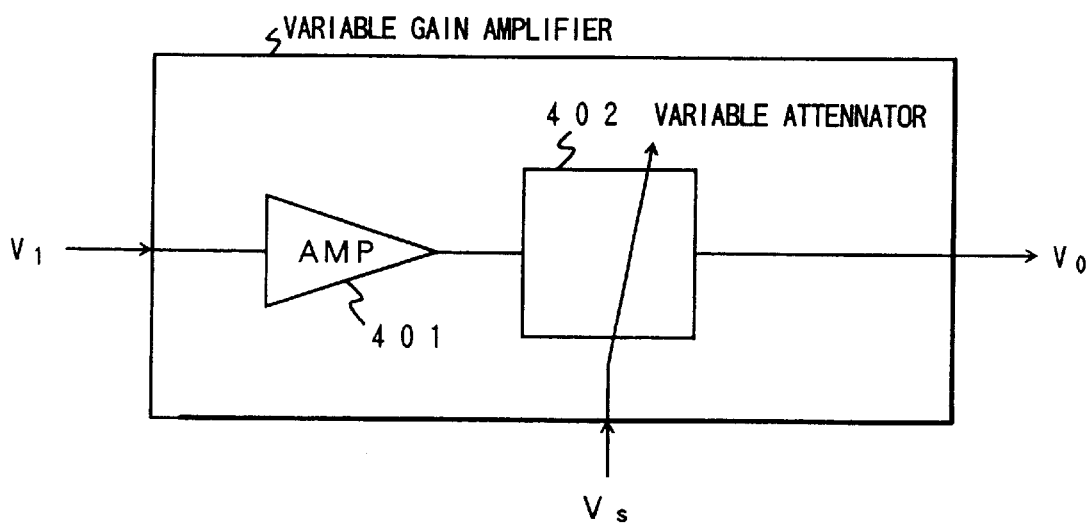
FIG. 7B is a diagram showing another example of a variable gain amplifier used in the first, second and third embodiments of the gain control circuit.

Referring to FIG. 7B, the fixed-gain amplifier 401 amplifies an input signal $V_I$ before the variable attenuator 402 attenuates the amplified input signal according to the gain control signal. In this arrangement, since the gain control is performed after amplification, the degradation of S/N is prevented.

Demodulator

Figure 8:
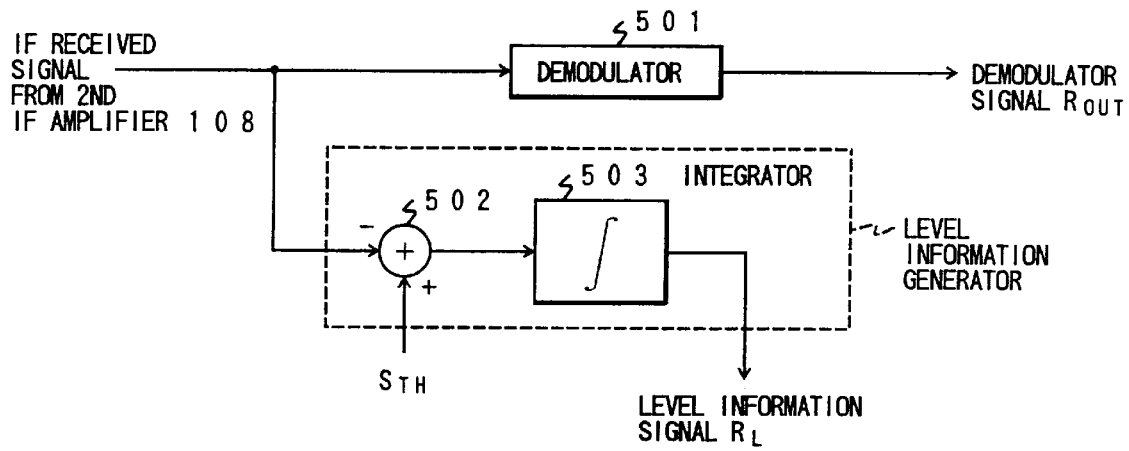
FIG. 8 is a diagram showing an example of a demodulator used in the radio receiver.

Referring to FIG. 8, the demodulator 109 as shown in FIG. 1 may include a demodulator 501 and a level information generator which is comprised of a subtractor 502 and an integrator 503. In the level information generator, the subtractor 502 subtracts the IF signal from the threshold level $S_{TH}$ and the integrator 503 integrates the result to produce the level information signal $R_L$. Since the integrator 503 integrates negative values when the level of the IF signal is greater than the threshold level $S_{TH}$ and positive values when the level of the IF signal is smaller than the threshold level $S_{TH}$, the level information signal $R_L$ varies in level until the level of the IF signal is equal to the threshold level $S_{TH}$.

Gain Control Signal Generator

Figure 9:
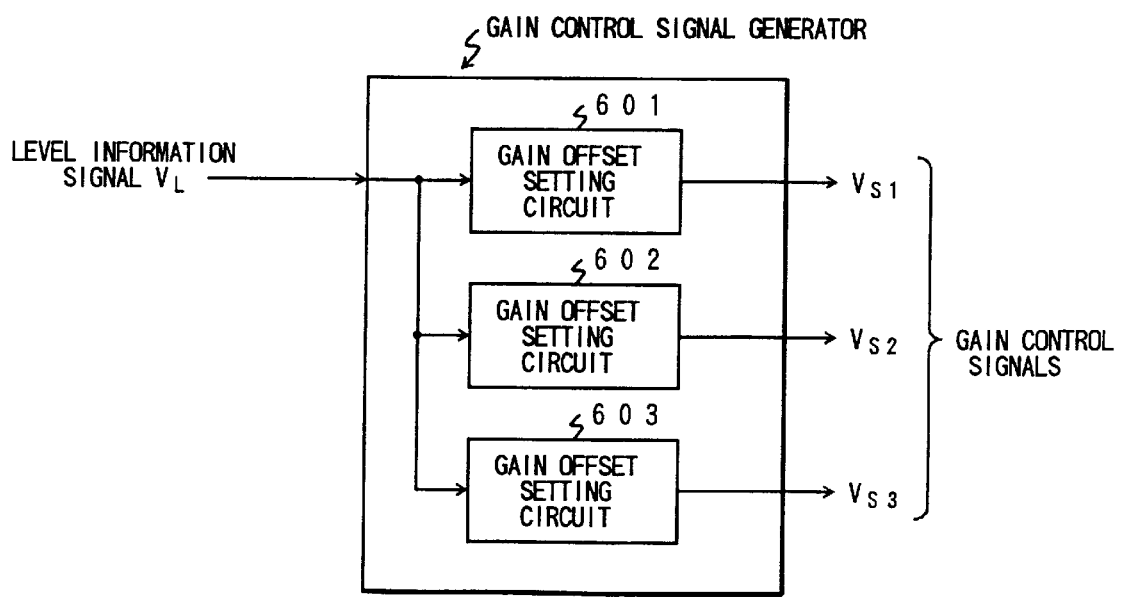
FIG. 9 is a diagram showing an example of a gain control signal generator used in the first, second and third embodiments of the gain control circuit.

Referring to FIG. 9, the gain control signal generator includes a plurality of gain offset setting circuits 601–603. The respective gain offset setting circuits receive a level information signal $V_L$ and produce gain control signals $V_{S1}$–$V_{S3}$. The level information signal $V_L$ is the level information signal $R_L$ or the transmission level signal $T_{SO}$ and the gain control signals $V_{S1}$–$V_{S3}$ are the gain control signals $R_{S1}$–$R_{S3}$ or $T_{S1}$–$T_{S3}$ in the above embodiments. The respective gain offset setting circuits 601–603 provide different offset amounts of gain and the same slop of gain characteristic as shown in FIGS. 2, 3 and 5, where the offset amount of gain is set to provide a shift of starting and terminating points of gain variation.

Figure 10:
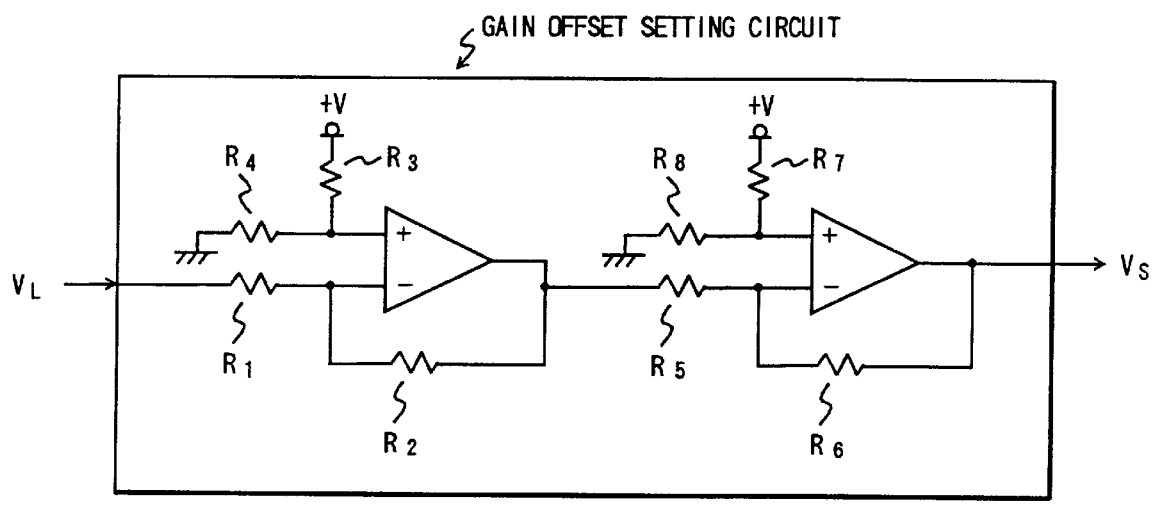
FIG. 10 is a diagram showing an example of a gain offset setting circuit used in the gain control signal generator of FIG. 9.

Referring to FIG. 10, each gain offset setting circuit may be comprised of two inverting amplifiers which are connected in series to form a non-inverting amplifier. The controlled gain G of the corresponding variable-gain amplifier is determined based on the ratio of resistances $R_1$ and $R_2$ and the ratio of resistances $R_5$ and $R_6$. The offset amount of gain is determined based on the applied voltage V, the ratio of resistances $R_3$ and $R_4$, and the ratio of resistances $R_7$ and $R_8$.

Figure 11:
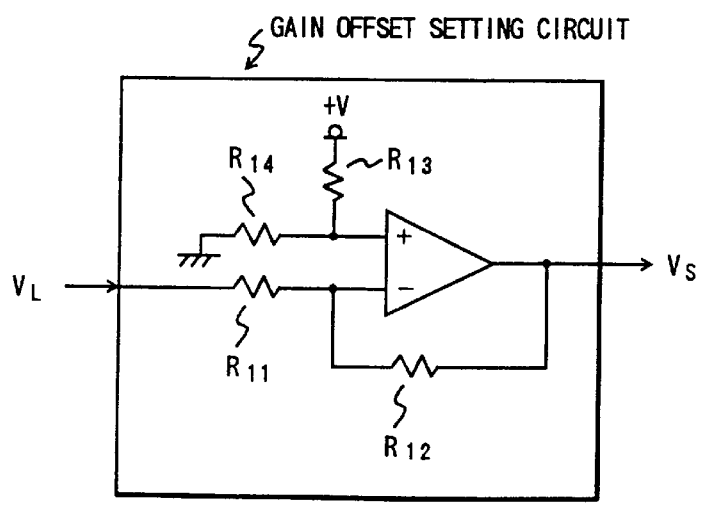
FIG. 11 is a diagram showing another example of a gain offset setting circuit used in the gain control signal generator of FIG. 9.

Referring to FIG. 11, each gain offset setting circuit may be comprised of one inverting amplifier. In this case, the higher the level information signal $V_L$, the lower the gain of the corresponding variable-gain amplifier. Therefore, in the case where the level information signal $V_L$ increases as the level of the IF signal of the receiver as shown in FIG. 1 becomes higher or where the corresponding variable-gain amplifier reduces in gain as the level of the gain control signal becomes higher, the gain offset setting circuit of the inverting amplifier is usable.

Transmission Level Detector

Figure 12:
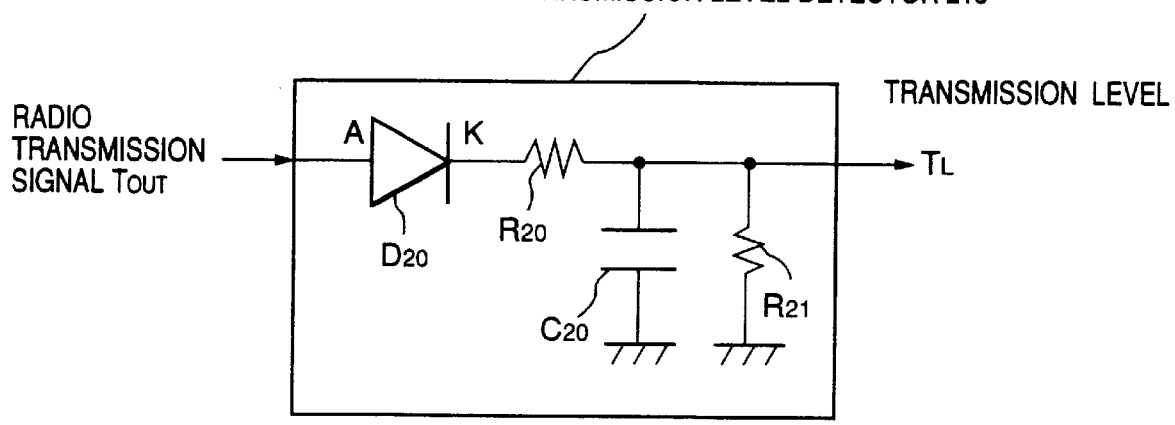
FIG. 12 is a diagram showing an example of a level information generator used in the radio transmitter of FIG. 6.

Referring to FIG. 12, the transmission level detector 213 of the radio transmitter may be comprised of a diode $D_{20}$ for half-wave rectification and a smoothing circuit comprising a resistor $R_{20}$, a capacitor $C_{20}$ and a resistor $R_{21}$. The diode $D_{20}$ rectifies the radio transmission signal $T_{OUT}$ and the rectified signal is smoothed to the transmission level signal $T_L$.

Figure 13:
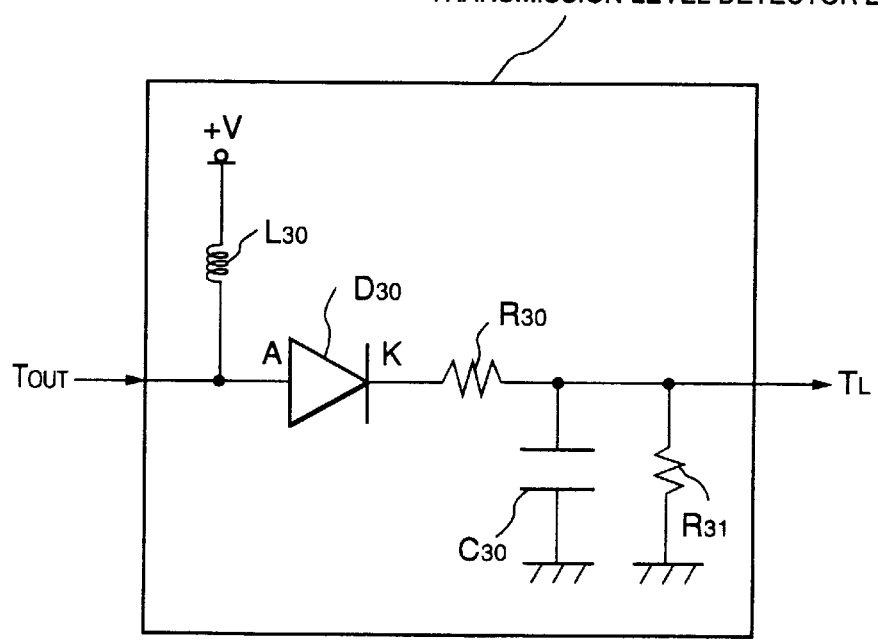
FIG. 13 is a diagram showing another example of a level information generator used in the radio transmitter of FIG. 6.

Referring to FIG. 13, the transmission level detector 213 of the radio transmitter may be comprised of a diode $D_{30}$ for half-wave rectification and a smoothing circuit comprising a resistor $R_{30}$, a capacitor $C_{30}$ and a resistor $R_{31}$. The transmission level detector 213 is further provided with an inductor $L_{30}$ through which a fixed voltage +V is applied to the anode A of the diode $D_{30}$. The diode $D_{30}$ rectifies the radio transmission signal $T_{OUT}$ and the rectified signal is smoothed to the transmission level signal $T_L$. Since a constant direct bias is applied to the anode of the diode $D_{30}$ through the inductor $L_{30}$, the inductor $L_{30}$ is capable of suppressing degradation of level detection sensitivity caused by a forward voltage drop of the diode $D_{30}$.

What is claimed is:

1. A gain controller for use in a radio receiver, the radio receiver receiving an input signal, the gain controller individually controlling variable-gain amplifiers so as to keep a constant level of a final output signal input to a demodulator, the gain controller comprising:

at least a first, second, and third variable-gain amplifier and a frequency converter connected in series in a direction of signal flow of the input signal to the final output signal in the radio receiver;

a first stage including at least the first variable-gain amplifier, the first stage receives the input signal and produces a first output signal;

the frequency converter receives the first output signal and produces a second output signal in response thereto, the second output signal having a frequency lower than a frequency of the first output signal;

a second stage including at least the third variable-gain amplifier, the second stage receives the second output signal and produces the final output signal;

a demodulator, which receives the final output signal and produces level information indicating a level of the final output signal;

a gain control signal generator which receives the level information; and a first, second and third gain control line connected to the gain control signal generator and a respective one of the first, second, and third variable-gain amplifiers; wherein the gain control signal generator generates and sends a gain control signal to the second variable-gain amplifier so that the second variable-gain amplifier decreases in gain, when the gain control signal generator determines from the level information that the input signal is increasing in level and is below a threshold; and the gain control signal generator further generates and sends gain control signals to the first variable-gain amplifier and the third variable-gain amplifier so that the first variable-gain amplifier decreases in gain before the third variable-gain amplifier decreases in gain, when the gain control signal generator determines from the level information that the input signal is increasing in level and is above the threshold.

2. The gain controller according to claim 1, wherein the frequency converter is connected between the first and second variable-gain amplifiers and the demodulator is connected to the second variable-gain amplifier through the third variable-gain amplifier.

3. A method for individually controlling variable-gain amplifiers of a radio receiver so as to keep a constant level of a final output signal input to a demodulator, the radio receiver comprising:

at least first, second, and third variable-gain amplifiers and a frequency converter connected in series in a direction of signal flow of the input signal input to the radio receiver to the final output signal input to the demodulator;

a first stage which includes at least the first variable-gain amplifier, the first stage receives the input signal and produces a first output signal;

the frequency converter receives the first output signal and produces a second output signal in response thereto, the second output signal having a frequency lower than a frequency of the first output signal;

a second stage which includes at least the third variable-gain amplifier, the second stage receives the second output signal and produces the final output signal; and the demodulator receives the final output signal and produces level information indicating a level of the final output signal;

the method comprising the acts of:

sending a gain control signal to the second variable-gain amplifier so that the second variable-gain amplifier decreases in gain, when it is determined from the level information that the input signal is increasing in level and is below a threshold; and sending gain control signals to the first variable-gain amplifier and the third variable-gain amplifier so that the first variable-gain amplifier decreases in gain before the third variable gain amplifier decreases in gain, when it is determined from the level information that the received signal is increasing in level and is above the threshold.

4. A receiver for receiving an input signal, the receiver comprising:

at least a first, second, and third variable-gain amplifier and a frequency converter connected in series;

a first stage including at least the first variable-gain amplifier, the first stage being followed by a second stage including at least the third variable-gain amplifier;

the first stage receiving the input signal and producing a first output signal;

the frequency converter converting the first output signal into a second output signal, the second output signal having a lower frequency than a frequency of the first output signal;

the second stage receiving the second output signal and producing a final output signal;

a level detector which detects a level of the final output signal and produces a level information signal; and a gain controller which receives the level information signal, the gain controller controls the second variable-gain amplifier so that the second variable-gain amplifier decreases in gain, when the gain controller determines from the level information signal that the input signal is increasing in level and is below a threshold; and the gain controller controls the first variable-gain amplifier and the third variable-gain amplifier so that the first variable-gain amplifier decreases in gain before the third variable-gain amplifier decreases in gain, when the gain controller determines from the level information signal that the received signal is increasing in level and is greater than the threshold.

* * * * *